United States Patent [19]

Rehbein et al.

[11] Patent Number: 4,468,624

[45] Date of Patent: Aug. 28, 1984

[54] PROGRAMMABLE SYNCHRONOUS DIGITAL DELAY LINE

[75] Inventors: Thomas J. Rehbein, Taberg; Wayne Bonser, Poland, both of N.Y.

[73] Assignee: The United States of America as represented by the Secretary of the Air Force, Washington, D.C.

[21] Appl. No.: 171,913

[22] Filed: Jul. 23, 1980

[51] Int. Cl.³ .................... H03K 3/017; H03K 3/86; H03K 5/14
[52] U.S. Cl. ...................................... 328/55; 328/61; 364/701
[58] Field of Search ................... 364/701; 328/50, 55, 328/56, 57, 58, 60, 61, 155; 375/111, 113; 365/193, 194, 239

[56] References Cited

U.S. PATENT DOCUMENTS

| | | | |
|---|---|---|---|
| 3,015,091 | 12/1961 | Nyberg et al. | 365/194 X |
| 3,962,689 | 6/1976 | Brunson | 365/239 |
| 4,075,569 | 2/1978 | Wright | 328/58 |
| 4,165,490 | 8/1979 | Howe, Jr. et al. | 328/55 X |
| 4,167,707 | 9/1979 | Gemp | 328/55 |

Primary Examiner—Felix D. Gruber

Attorney, Agent, or Firm—Donald J. Singer; Willard R. Matthews

[57] ABSTRACT

A synchronous digital delay line that can be programmed by variable delay increments to independently delay the leading and trailing edges of a digital signal and that can be utilized to provide a wide range of digital delaying requirements. Bipolar input data is processed to develop a mark data pulse stream representing the leading edges of input data pulses and a space data pulse stream representing the trailing edges of input data pulses. Each data pulse stream is delayed separately by a programmable random access memory delay circuit and the delayed outputs are recombined by a line driver latch to provide output data pulses that are delayed, delayed and compressed, or delayed and stretched in accordance with the programmed delays and system requirements. The programmable random access memory delay circuits each comprise a random access memory used as a variable length register having an address counter operating as a ring counter. Delay is varied by altering the maximum address at which the address counter is reset and is the product of the address clock rate and the 3 number of bits of memory used. The length of delay, delay increments, and stability, therefore, are a function of the clock source, clock rate, and memory size.

14 Claims, 12 Drawing Figures

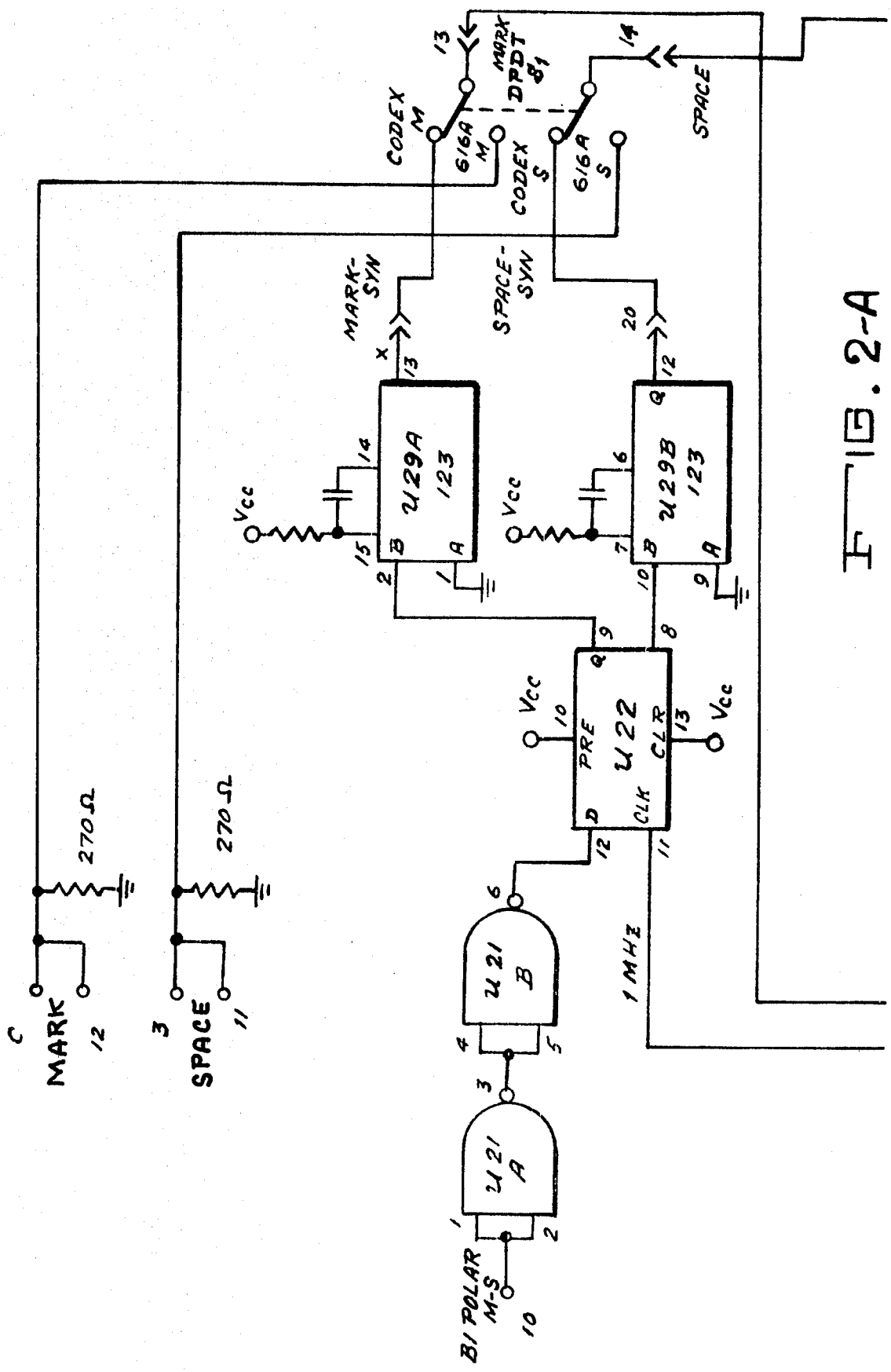
FIG. 2-A

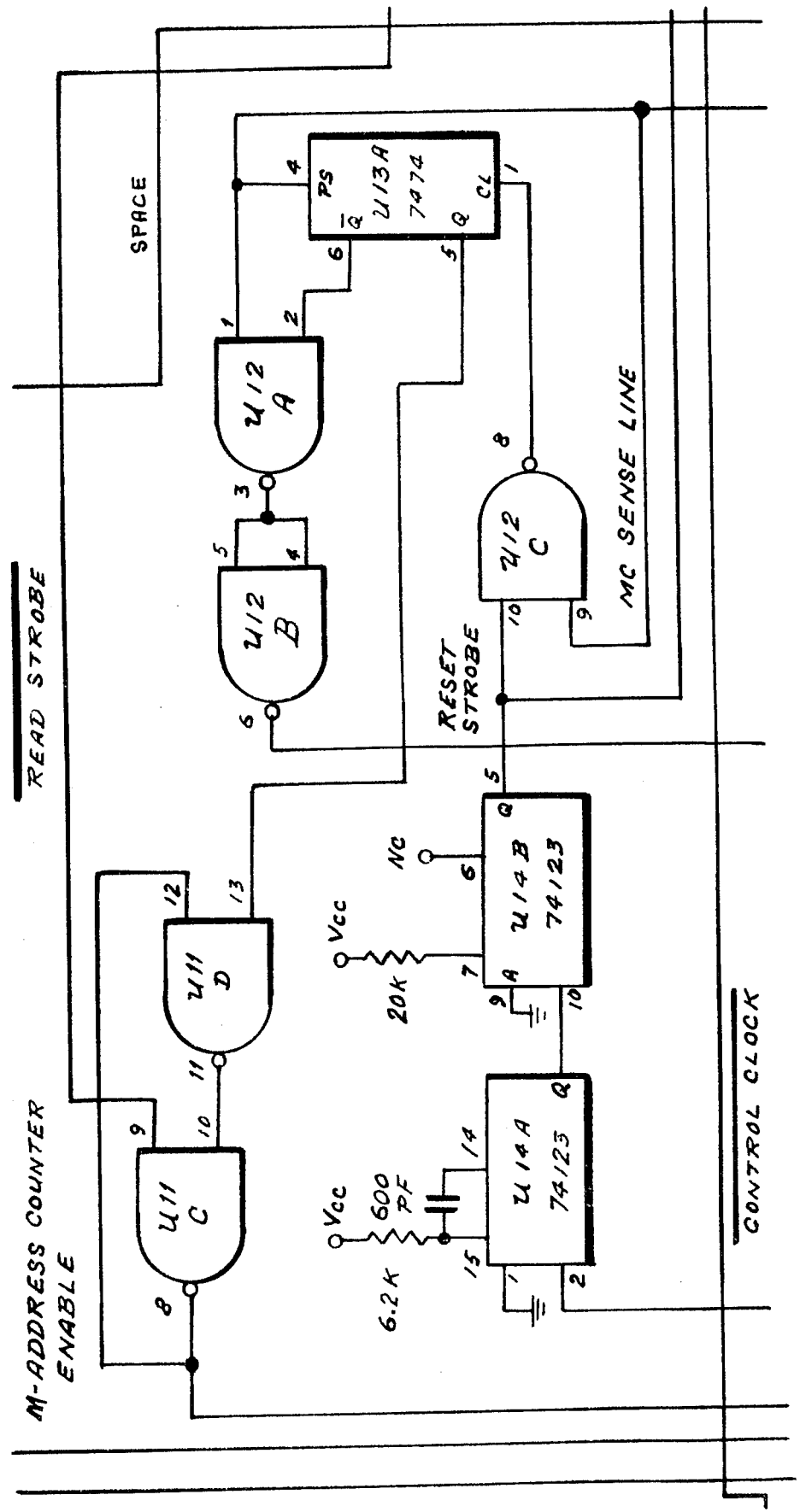
FIG. 2-B

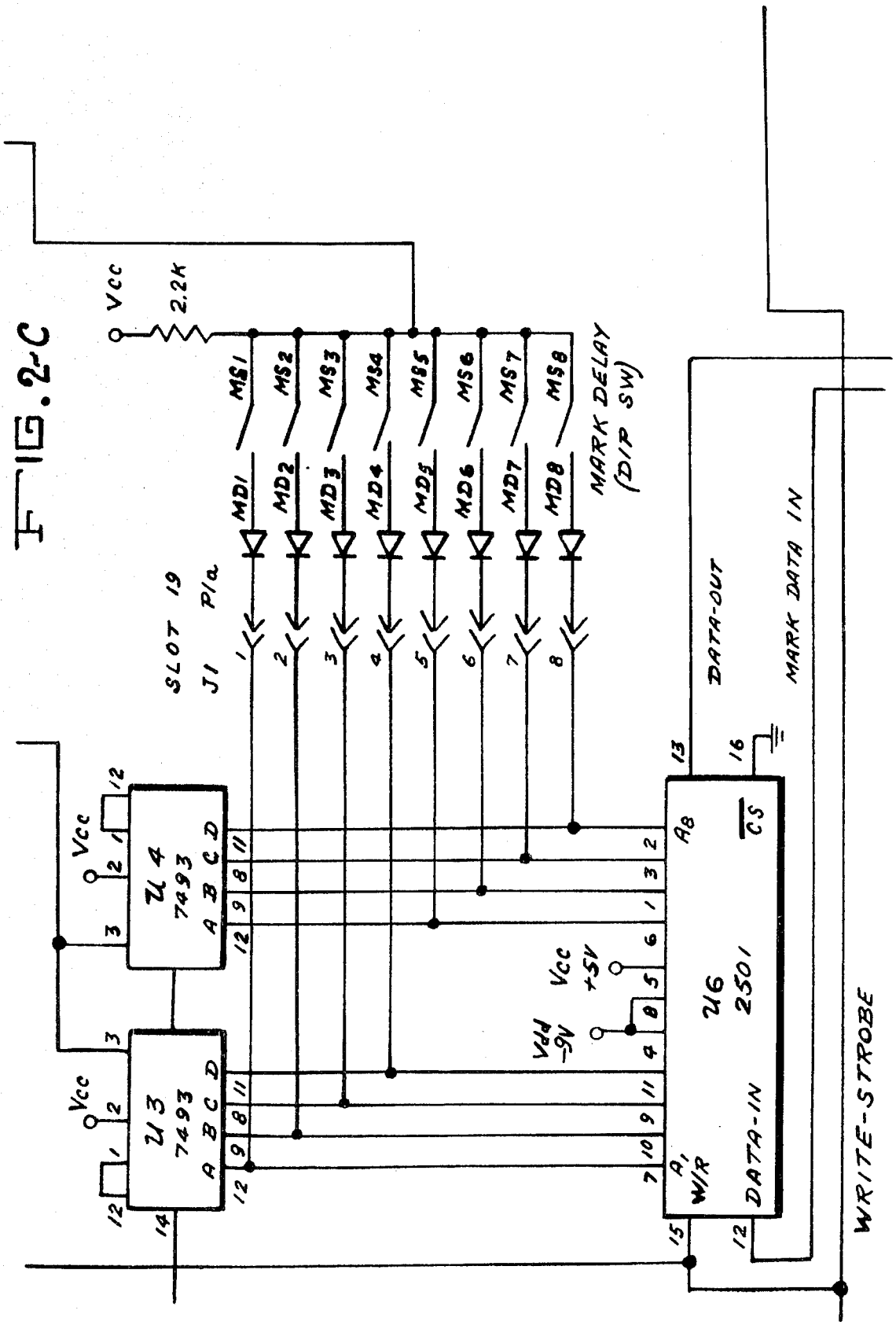
FIG. 2-C

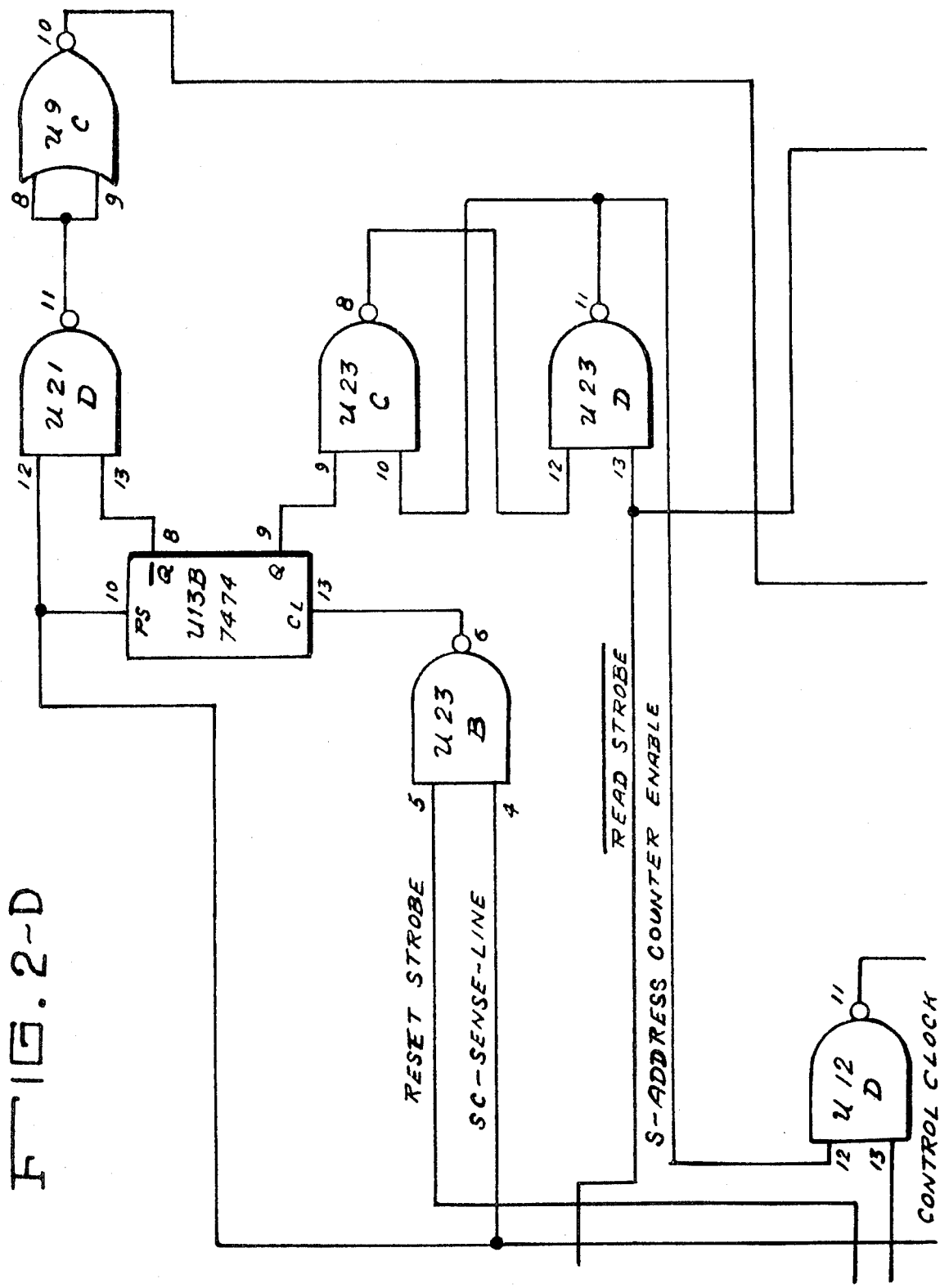
FIG. 2-D

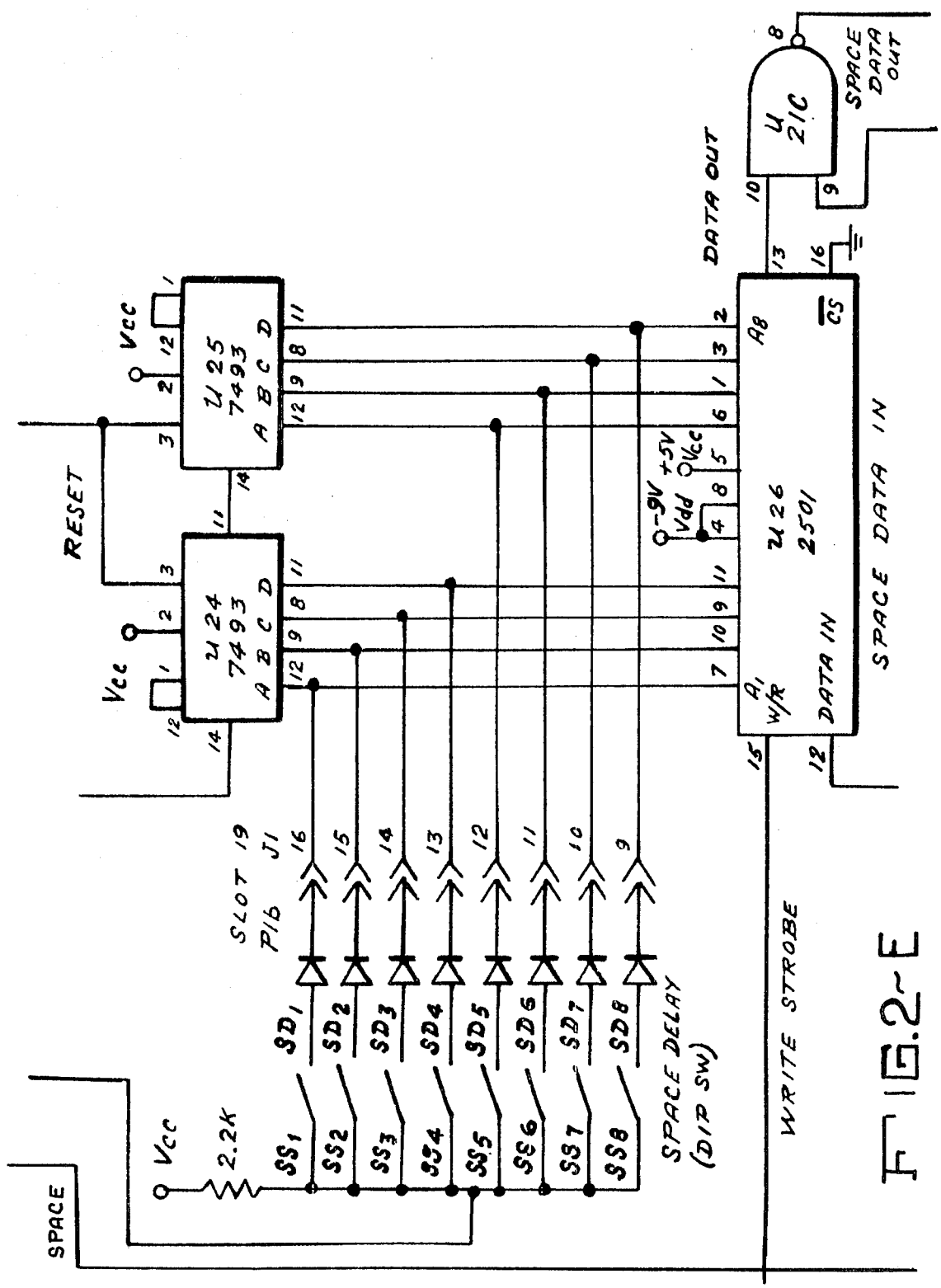

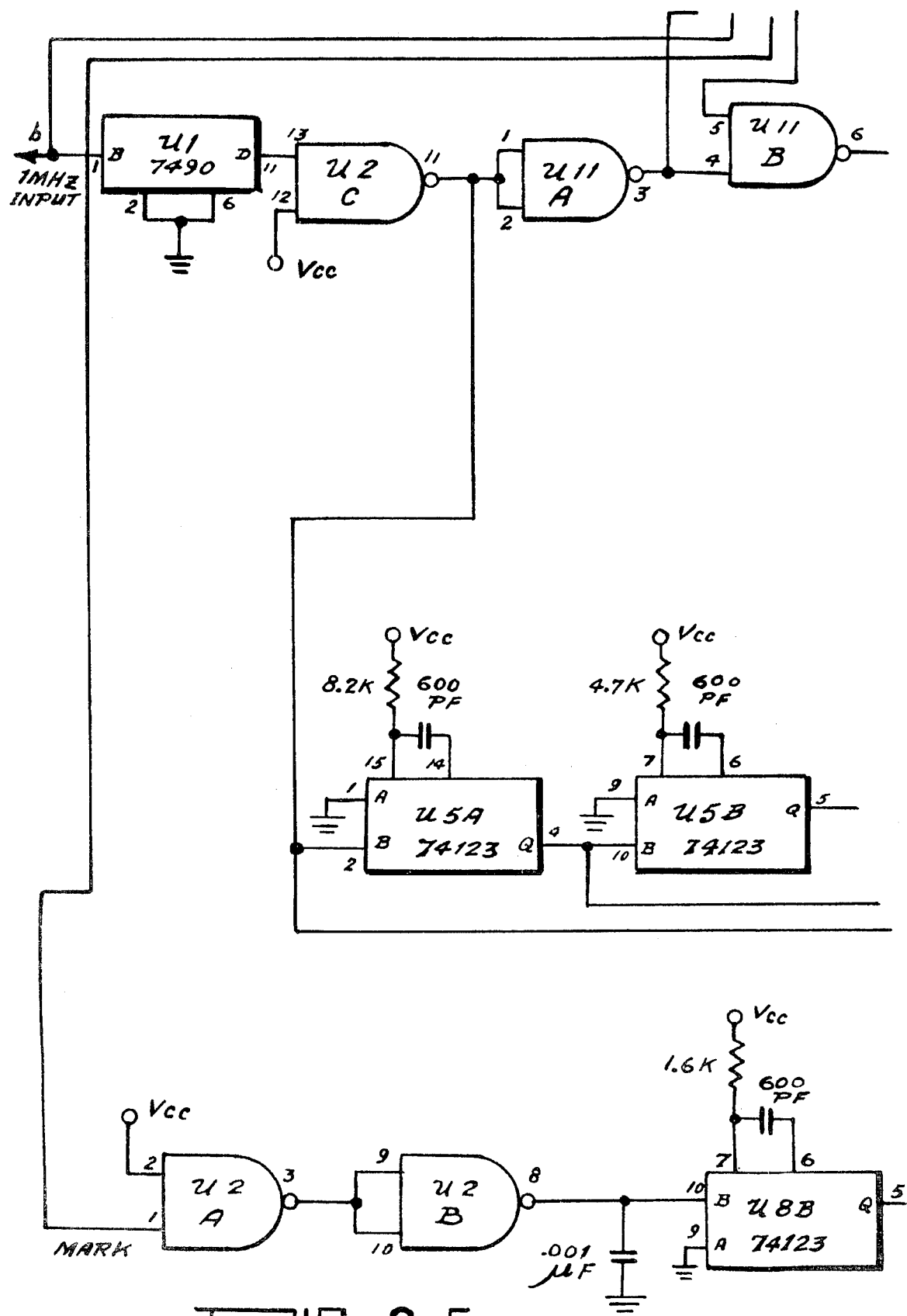
FIG. 2-F

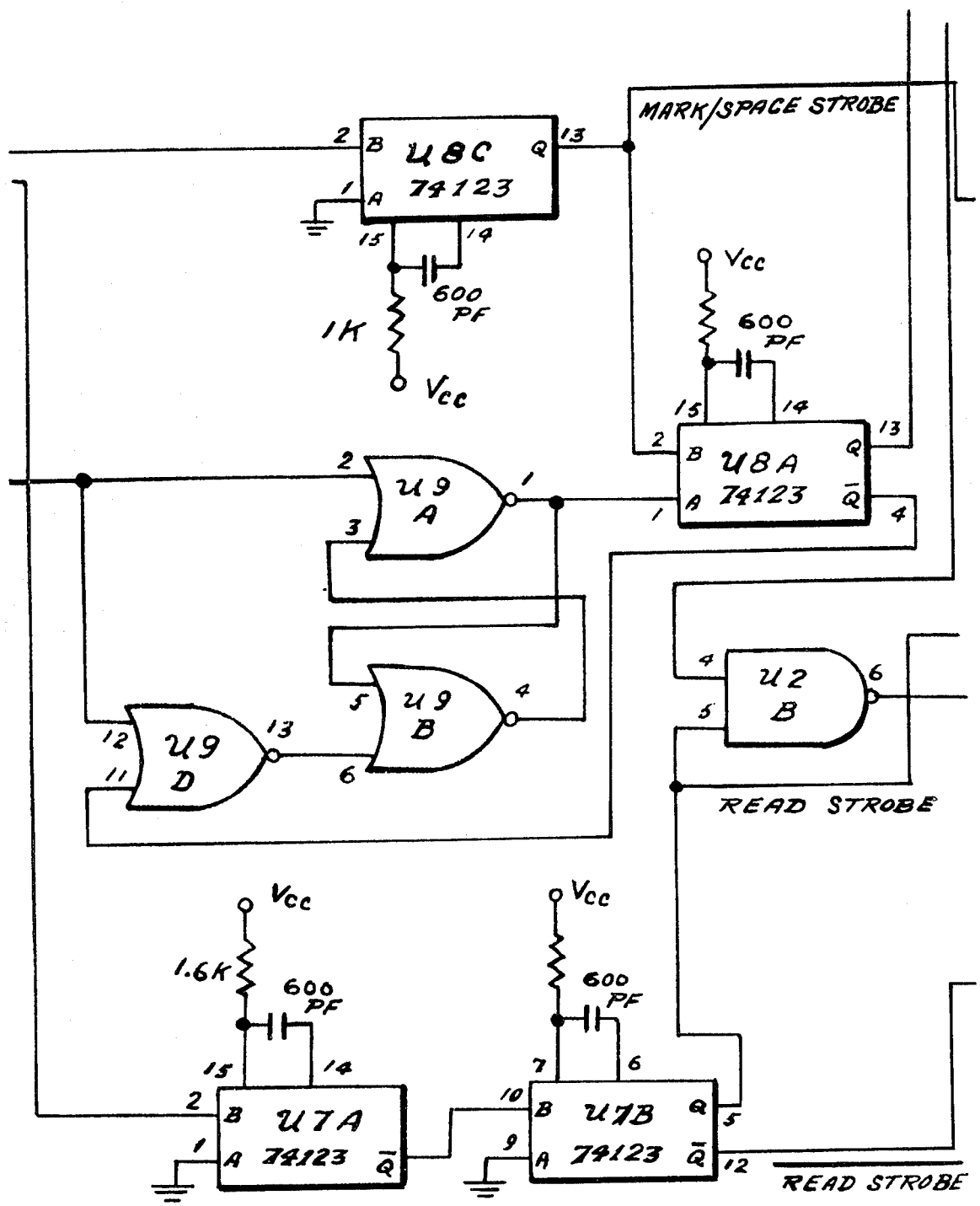
FIG. 2-G

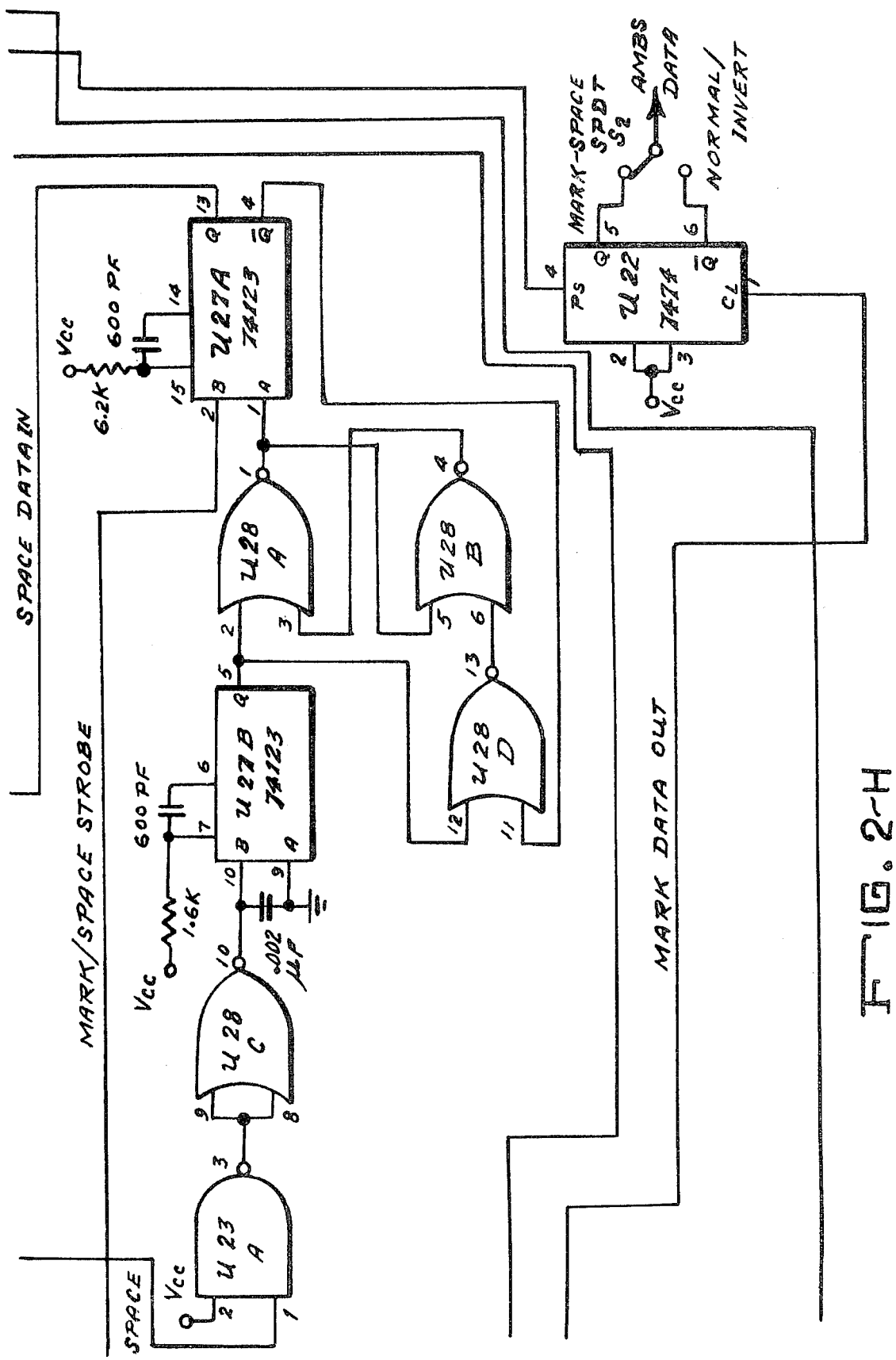

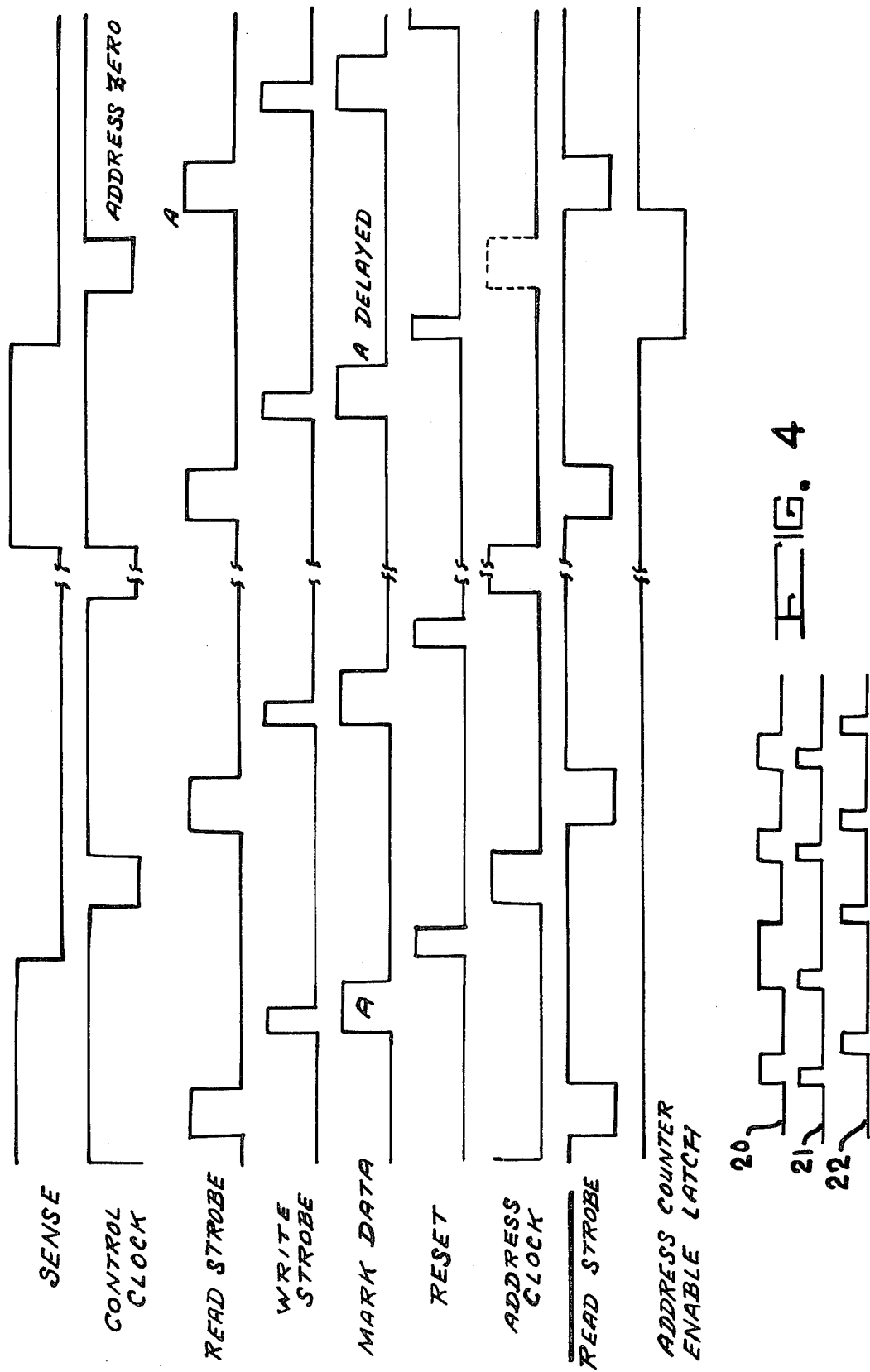

PROGRAMMABLE SYNCHRONOUS DIGITAL DELAY LINE

STATEMENT OF GOVERNMENT INTEREST

The invention described herein may be manufactured and used by or for the Government for governmental purposes without the payment of any royalty thereon.

BACKGROUND OF THE INVENTION

This invention relates to digital delay lines and in particular to a programmable synchronous digital delay line that is adapted to delay, delay and compress, or delay and stretch digital data pulses.

There currently exists the need for a digital delay device that will accurately delay digital data to accomplish synchronization of devices or compensation of timing (propagation) delays through digital equipment.

An example of such a need is found in the VLF/LF communications area. Specifically, there is a requirement in a U.S. Air Force prototype where new digital modems for the Air Force 487L system require the use of this type of device to supply an Antenna Tuning unit with digital data which is synchronized to the RF power applied to the antenna itself. In order to precisely synchronize the digital data to the RF output slewing waveform at the system Voltage Controlled Oscillator (VCO), it is mandatory that both the leading and trailing edges (which represent frequency changes) of the digital data be independently controllable. In this system a modulator provides the mark (leading edge) and space (trailing edge) pulses required to allow an automatic antenna tuning device to switch frequencies as the transmitter power output passes through zero. Retuning the antenna at the zero cross over points reduces voltage standoffs and reflected powers to tolerable levels. However, the characteristics of the modulator are such that the slew time from mark to space frequency is not necessarily the same as from space to mark frequency and therefore must be treated separately in two independent digital delay channels. Further, there is a finite time required for the automatic antenna timing device to change frequency once it has received the signal to do so.

Separate processing of mark and space pulse trains to an acceptable degree of accuracy, however, is not readily accomplished with state of the art digital delay techniques. In order to achieve acceptably high accuracy using currently available delay devices a very high clock rate would be necessary requiring an extremely long shift register running very fast. Furthermore, separate processing of mark and space pulse trains with currently available digital devices requires two sets of digital delay circuits together with a switching matrix, making the system very complex and prohibitively expensive in many instances.

The present invention solves these problems by providing a programmable synchronous digital delay that allows independent control of the leading and trailing edges of the data pulses with simplified digital circuits thereby obtaining large delays together with data pulse leading and trailing edge control using minimum hardware.

SUMMARY OF THE INVENTION

The invention is directed to a synchronous digital delay line that is programmable to independently delay mark and space pulse trains that represent the leading and trailing edges of the digital data signal being processed. The digital data signals are first converted to mark and space pulse trains. Each pulse train is then stored in a separate random access memory. Data is read into and out of the random access memories by means of programmable address counters. A control clock operating from a single frequency source provides all system timing signals. The read out mark or space pulse trains are then combined by a line driver latch to provide the delayed digital data output.

In operation the synchronous digital delay line of the invention recognizes changes in the digital input line and stores this data in the random access memories until it is read out again after a discrete number (programmable) of memory cycles. The number of memory cycles between when the data is written (stored) and then read, multiplied by the cycle time determines the delay time. The cycle time (clock rate) determines the size of the delay increments and the memory size determines the maximum number of possible delay increments. The memory address counters are programmed (via front panel switches) to reset at the number of memory cycles (locations) necessary to obtain the desired delay.

It is a principal object of the invention to provide a new and improved programmable synchronous digital delay line.

It is another object of the invention to provide digital delay means that will accurately delay digital data and accomplish synchronization of devices and compensation of timing delays through digital equipment.

It is another object of the invention to provide a programmable synchronous digital delay line that is adapted to accurately delay, delay and compress, or delay and stretch digital data pulses.

It is another object of the invention to provide a programmable synchronous digital delay means that is completely digital in design and timed to a single frequency source which provides all timing signals wherein stability and accuracy are totally a function of clock rate and wherein the total programmable delay length is dependent on memory size.

It is another object of the invention to provide a programmed synchronous digital delay line that can be adapted to almost any digital delaying requirement.

It is another object of the invention to provide digital delay means for processing bipolar input data pulses by independently programming the delay of mark and space pulse streams which are subsequently recombined to provide an output data pulse stream.

It is another object of the invention to provide digital delay means for separately processing mark and space data streams that is less complex and requires fewer hardware components than prior state of the art devices.

These, together with other objects, features and advantages of the invention, will become more readily apparent from the following detailed description when taken in conjunction with the illustrative embodiment of the accompanying drawings.

DESCRIPTION OF THE DRAWINGS

FIG. 3 illustrates various control and timing waveforms utilized in the operation of the invention; and FIG. 4 illustrates a typical input digital data pulse stream together with associated mark and space data pulse streams.

DETAILED DESCRIPTION OF THE PREFERRED EMBODIMENT

The invention comprehends a Programmable Synchronous Digital Delay that allows independent control of leading and trailing edges. The advantage of this technique is that large delays may be obtained with minimum hardware. In general, delay length and the incremental change in delay is limited only by memory size and cycle time. The input data rate is limited by the memory cycle time on a one-to-one basis. The apparatus of the invention consists of leading and trailing edge circuitry that first divides the input data stream into pulses that represent leading or trailing edges. The leading edge is defined as mark and the trailing edge is defined as space. The mark and space pulses are independently delayed and then recombined at the output. Independent delays of the mark and space pulse streams are obtained by using RANDOM ACCESS MEMORYS (RAM) as variable length resistors. A memory address counter addressing each RAM is used sequentially as a ring counter. The memory is cycled to a read-before-write mode, from address zero to a fixed maximum address and then reset to zero to start again. In this manner, the memory is "spun" and the data written into any memory location appears again a set time later (determined by the addressing rate and the maximum address value) when that memory location is readdressed. The delay can be varied by altering the maximum address at which the address counter is reset. Therefore, if an address clock rate is chosen at 5 $\mu$s (200 KHz) and a 256 bit memory is used, the largest delay which could be obtained is 256×5 $\mu$s=1280 $\mu$s. If the maximum address (where the address counter is reset) is fixed at 100, the delay incurred will be 100×5 $\mu$s or 500 $\mu$s.

Figure 1:
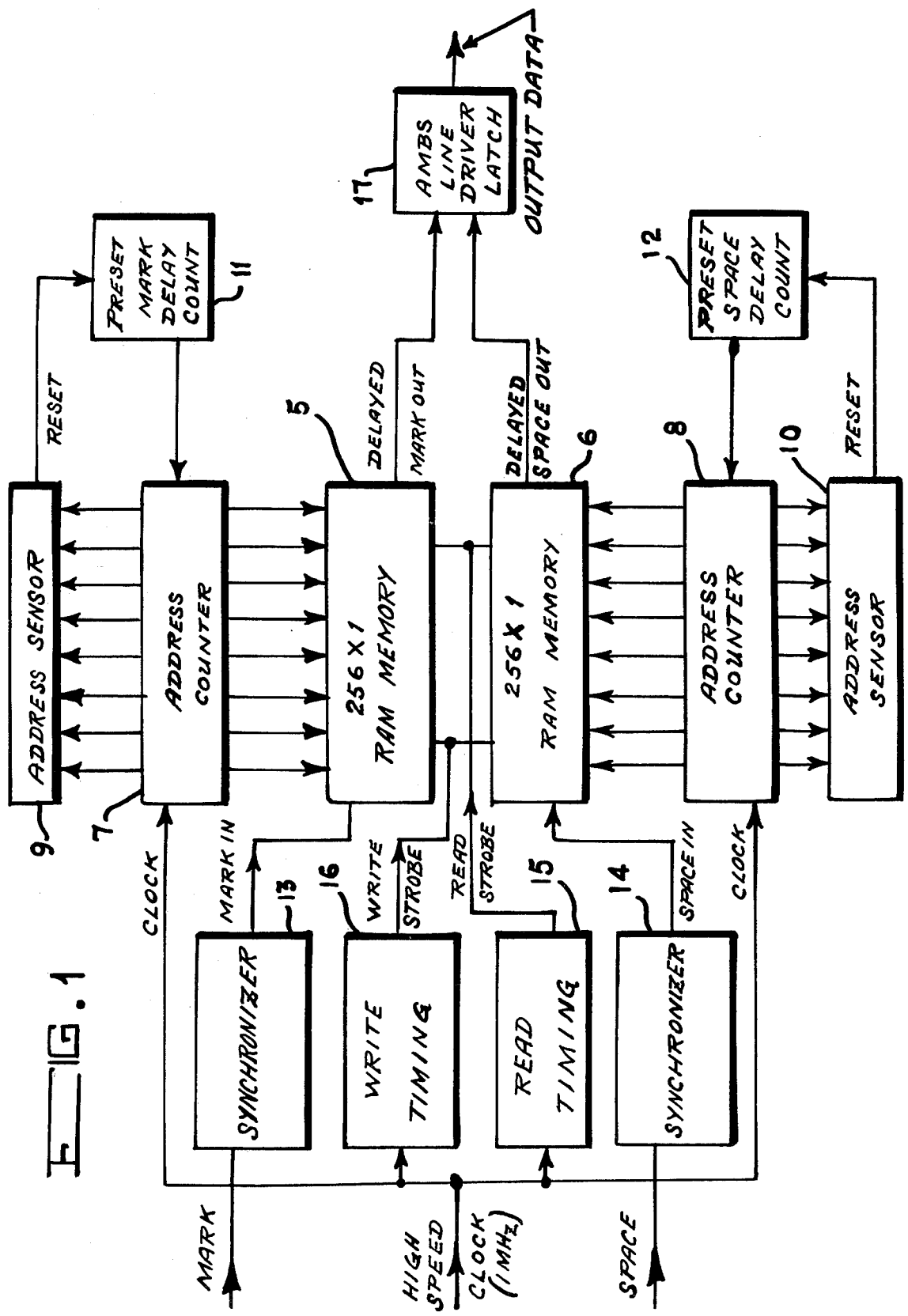
FIG. 1 is a functional block diagram of the programmable synchronous digital delay line of the invention.

A functional block diagram of the programmable synchronous digital delay line of the invention is shown in FIG. 1. Referring thereto it is noted that mark and space digital pulse streams are inputted to RAM memories 5 and 6 respectively through synchronizer circuits 13, 14. The mark and space digital pulse streams may be taken directly from systems that provide signal data in this form or they may be generated from bipolar digital input data by means of circuitry hereinafter described. The digital delay function for the mark digital pulse stream is provided by RAM memory 5, address counter 7, address sensor 9 and preset mark delay count 11. The digital delay function for the space digital pulse stream is provided by RAM memory 6, address counter 8, address sensor 10 and preset space delay counter 12. The lengths of the delays is set by appropriately programming the address counters by means of the delay count circuits. The mark and space digital data pulse streams are written into the delay means by write timing 16 and are read out of the delay means into line driver latch 17 by means of read timing circuit 15. Read timing circuit 15 and write timing circuit 16 include a control clock which generates timing pulses for all system functions from the high speed system clock shown. Line driver latch 17 combines the delayed mark and space pulses to provide the desired output data pulse streams.

Figure 2:
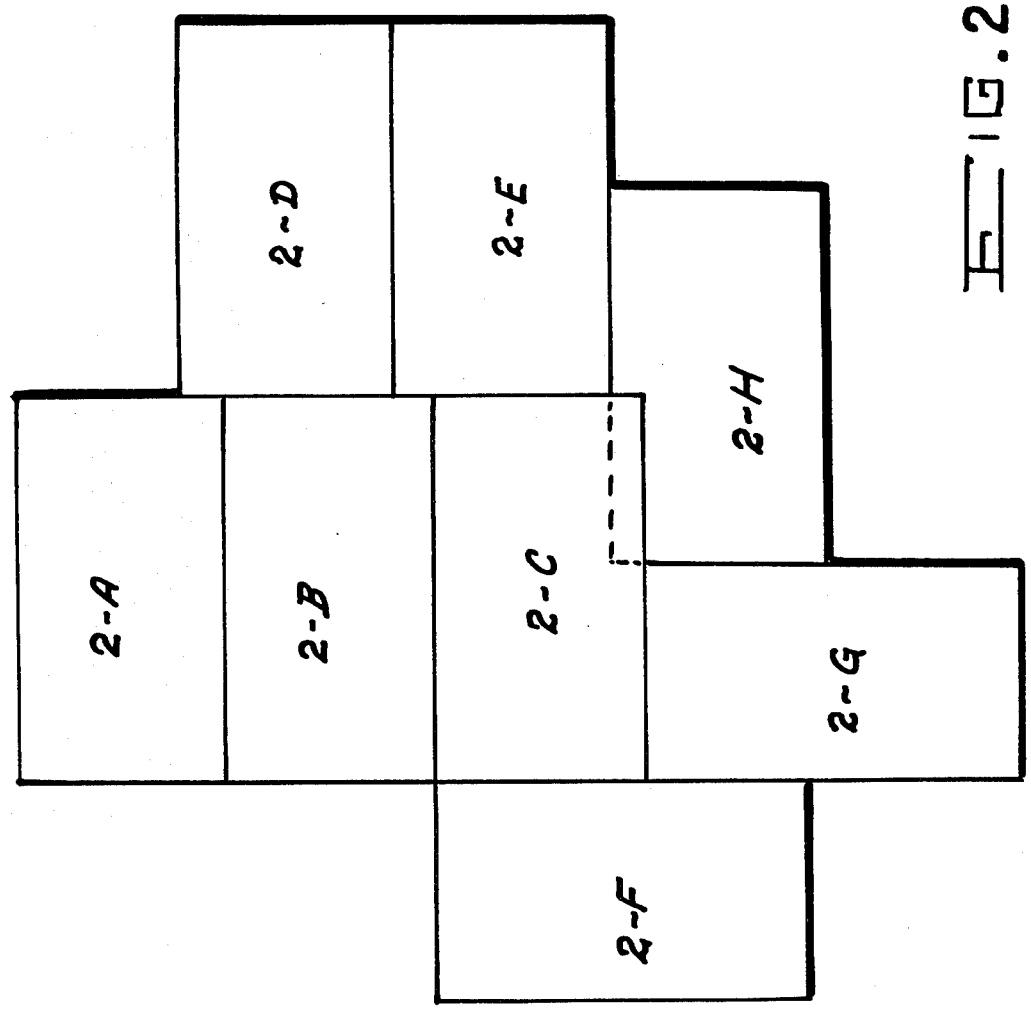
FIG. 2 being comprised of FIGS. 2A through 2H is a schematic diagram of the digital delay line of the invention.

Referring now to FIG. 2 and particularly to FIGS. 2A-2H there is shown a schematic diagram of hardware implementation of the programmable synchronous digital delay line functionally illustrated in FIG. 1. The mark and space digital pulse streams can be obtained directly from the system into which the delay line is incorporated by means of switch DPDTS1. Alternatively, the mark and space data can be developed from bipolar digital data input by the circuit comprising NAND gate U21 A and B, latch U22, leading pulse generator multivibrator U29A and trailing edge detecter multivibrator U29B.

The mark data random access memory is shown as U6 and its address counter comprises the circuit of NAND gate U11C, U11B and four bit binary counters U3 and U4. The mark delay count function is realized by means of diodes MD1-MD8 and switches MS1-MS8. The mark address sensor function is performed by the circuit consisting of NAND gate latch U11C, U11D, reset multivibrators U14A, U14B, latch U13A and NAND gates U12A, U12B, U12C. The mark synchronizer circuit comprises NAND gate U2A, U2B serving as a buffer and providing pulses to trigger multivibrator U8B, NOR gate latch U9A, U9B, U9D, triggered one shot multivibrators U8A and mark space strobe generator U8C.

The space data circuitry is identical. The space RAM is shown at U26 and its address counter comprises NAND gate U12D and four bit binary counters U24, U25. The space delay function is provided by diodes SD1-SD8 and switches SS1-SS8. The space address sensor function is provided by logic gates U23B, U23C, U23D, U21D, U9C and latch U13B. The reset provided by U14A, U14B is common to both mark and space circuits. The space synchronizer circuit consists of logic gates U23A, U28C, U28A, U28B, U28D and multivibrators U27A and U27B.

The delay line control clock operates from the 1MH input clock as shown and comprises divide by 5 decade counter U1 and NAND gate U2C.

Write timing is accomplished by means of the write strobe generator U5A, U5B and read timing is accomplished by means of the read strobe generator U7A, U7B, both operating off the control clock.

Delayed mark and space pulses are read out through NAND gates U2B and U21C to latch U22 which comprises the line driver latch output combiner. Normal or inverted outputs can be obtained by means of switch SPDT 32.

Referring to FIG. 3 there is illustrated thereby the various control and timing waveforms utilized in the operation of the invention and their relationship to each other.

The following definitions describe various terms and functions used in the ensuing circuit description.

CONTROL CLOCK: A 200 KHz (5 microsecond) clocking signal used to derive all other timing signals and update the programmable ring counter. The rate of this clock determines the delay time increment size. The maximum count (programmed) supplied to the memory determines the number of increments.

READ STROBE: A 0.8 $\mu$s pulse which gates the data from the memory data lines. The timing and duration of this pulse ensures that the data being gated is valid data (stabilized and undisturbed by address or read/write enable line transitions).

WRITE STROBE: A 1. $\mu$s pulse (high) that places the memory into a write mode.

MARK/SPACE STROBE: A shortened (0.4 μs) write strobe used to retime/sync the mark/space pulses to the control clock and position it, in time, to ensure the resulting "mark (space) data input" pulse is synchronized with the write time for the memory.

MARK(SPACE) DATA INPUT: The data 1.25 μs pulse to be written into memory which is derived from the mark/space pulse and gated by the "mark/space strobe".

RESET STROBE: A 0.2 μs pulse which, when gated through by a correct comparison of the ring counter's count and the programmed delay count, resets the ring (address) counter for the memory and forces the counter to miss the next control (address clock) clock and allows the memory address of zero to be then utilized before restarting the counter.

MARK (SPACE DATA) OUTPUT: 0.8 μs pulse which was delayed in time by the maximum programmed count for the memory times the control clock rate (5 μs). ex: 256 maximum memory×5. μs=1280 μs maximum delay. This pulse was gated from the memory data lines by the read strobe.

This invention is designed to accept bipolar data from a device such as a 3 KHz audio line modem. The bipolar data is converted to TTL levels through U21A and B. U22 and U29A and B are used to divide the data stream into two streams of pulses which represent the leading (mark) and trailing (space) edges of the input data. This is illustrated in FIG. 4 wherein data pulse train 20 is the output of U21B, pulse train 21 is the leading edge pulse train (mark) and pulse train 22 is the trailing edge pulse train (space).

U22 is a "D" type positive edge triggered latch (7474). The data level at input "D" pin 12 will be transferred to "Q" on the rise of the one MHz input clock. If "Q" is equal to "D", there will be no change with the rise of the clock. U29A, the leading edge pulse generator which will initiate a 6 μs pulse each time U22 (pin 9) rises to 5 volts. Conversely U29B the trailing edge detector will generate a pulse each time U22 (pin 8) rises to 5 volts. This circuit, therefore, generates leading edge pulses (marks) or trailing edge pulses (spaces) depending on the state (transition) of the input data.

Double pole-double throw switch DPDT-S1 will enable the input of signals already in a mark/space format (as is available from the Air Force VLF modem). When signals in the mark/space format are already available, the bipolar and mark/space converter circuits are bypassed.

The remaining space delay circuits are the same as the mark delay circuits and therefore only the mark circuits will be described.

The desired leading edge delay is set into the mark delay time set switches (slot 19). The mark data pulses (from the mark/space converter circuit) are processed through U2A and B which serve as a buffer and provide the pulses which trigger U8B. A 1 μs pulse is created and it sets the NOR latch and the output (U9A, pin 1) will go low and enable the triggered one-shot U8A When properly triggered, this device provides the "mark data" pulse which is the input to the Random Access Memory. The divide by 5 circuit of U1(7490) provides the 5 μs pulses (200 KHz) used to control all timing within the delay circuit. This 200 KHz clock is referred to as the "control clock". The "control clock" is utilized as the trigger for the write-strobe generator U5A and B. The output of U5A (which is delayed about 2 μs from the rise of the "control clock") triggers the "mark/space" strobe generator and the "write-strobe" generator. The "mark/space" strobe triggers the "mark data" one shot that is enabled by the NOR latch (U9, pin 1). The "mark data" one shot resets the NOR latch and appears at the input of U6 (a 2501 256 bit RAM). The write strobe arrives at the read/write input of U6 about the same time as the "mark data" but will fall in the middle of any existing "mark data" pulse ensuring that the proper level (5 volts: 1, 0 volts: 0) will be stored in the current memory location.

A "zero" (no pulse) at the "mark data" input to the RAM will be stored as a zero in the RAM at the location defined by the current value of the memory address counters (U3 and U4).

When the memory address counters (U3 and U4) reach a count equal to the value set into the mark delay time set switches (slot 19), the "MC-sense" line will go high enabling U12C (the diodes act as a wired AND comparator). The "reset strobe", which is continuously developed from "write-strobe", will clear the U13A latch which had previously been held set by the low "MC-sense" line. U12A now having a "1" on both inputs will reset the memory address counter to zero and cause U13A to once again be preset by the low "MC-sense" line (the mark delay switch value is greater than zero). The low ("0") from U13A on pin 2 of U12A will force a low on the reset line re-enabling the memory address counters. The NAND latch comprised of U11CED is used to prevent the next "control clock" from updating the memory address counters. The counter's clock must be disabled for one cycle to enable the use of memory location zero. Without this NAND latch, the memory address counter would be incremented to "one" before a read and write could be performed at address zero. The next inverted "read-strobe" pulse clears the NAND latch to allow the memory address counters to function normally incrementing at each fall of the "control clock".

Since each memory location is read before a write is performed, old data appears on the "data out" line (U6, pin 13) before the new data at the input (U6, pin 12) is stored. The delay is therefore incurred while a bit, having been stored in a memory location, waits for the memory address counters to return to that address so it can be read out of memory and back into the data stream.

The "mark-space" latch (U22) is used to recombine the mark and space pulses (leading and trailing edge indicators) which have been independently delayed into a single data pulse. A normal or an inverted output is available.

While the invention has been described in one presently preferred embodiment, it is understood that the words which have been used are words of description rather than words of limitation and that change within the purview of the appended claims may be made without departing from the scope and spirit of the invention in its broader aspects.

What is claimed is:

1. A programmable synchronous digital delay line comprising:
   means operating on a single frequency source clock for providing bipolar input data in the form of a mark data pulse stream representing the leading edges of input data pulses and a space data pulse stream representing the trailing edges of input data pulses,
   first and second programmable digital delay means, a write circuit for writing said mark data pulse stream into said first programmable digital delay means and said space data pulse stream into said second programmable delay means, a read circuit for reading mark and space data pulses out of said first and second programmable digital delay means, and a line driver latch output, said line driver latch receiving read out mark and space data pulses from said first and second programmable delay means and generating data output pulses therefrom.

2. A programmable synchronous digital delay line as defined in claim 1 including a control clock generating a clock pulse stream from said single frequency source clock, said clock pulse stream providing timing signals for said programmable synchronous digital delay line.

3. A programmable synchronous digital delay line as defined in claim 2 including a first synchronizer circuit generating a mark/space strobe from the output of said means for providing bipolar input data and controlling the input of mark data pulses to said first programmable digital delay means, and a second synchronizer circuit generating a mark/space strobe from the output of said means for providing bipolar input data and controlling the input of space data pulses to said signal programmable digital delay means.

4. A programmable synchronous digital delay line as defined in claim 3 wherein said first and second programmable digital delay means ech comprise a variable length register memory means, a sequentially operated address counter providing address to said memory means, an address sensor circuit monitoring the count of said address counters and generating address counter enable and reset pulses, and delay time program means setting the maximum address at which said address counter resets.

5. A programmable synchronous digital delay line as defined in claim 4 wherein said memory means is cycled in a read before write mode from address zero to maximum address and reset to zero.

6. A programmable synchronous digital delay line as defined in claim 4 wherein said variable length register memory means is a random access memory.

7. A programmable synchronous digital delay line as defined in claim 4 wherein said address counter comprises first and second four bit binary counters connected to operate as a ring counter.

8. A programmable synchronous digital delay line as defined in claim 4 wherein said delay time program means comprises a plurality of diodes and means for selectably switching each said diode between the digital delay line voltage source and said address counter said delay time program means operating as an AND comparator.

9. A programmable synchronous digital delay line as defined in claim 4 wherein said control clock comprises a decade counter.

10. A programmable synchronous digital delay line as defined in claim 4 wherein said means for providing bipolar input data comprises first and second NAND gates, said first NAND gate receiving bipolar input data and having its output connected to the inputs of said second NAND gate, and first, second and third multivibrators, said first multivibrator receiving the output of said second NAND gate and a single frequency clock and operating as a latch means, said second multivibrator receiving an output of said first multivibrator and outputting a mark data pulse stream, and said third multivibrator receiving an output of said first multivibrator and outputting a space data pulse stream.

11. A programmable synchronous digital delay line as defined in claim 4 wherein said first and second synchronizer circuits each comprise first and second serially connected gate means receiving an input data pulse stream and providing a buffer and trigger for a multivibrator, a NOR latch controlled by said multivibrator operating a triggered one-shot multivibrator, said one-shot multivibrator providing input data for said digital delay means, and a monostable multivibrator controlled by said one-shot multivibrator for generating a mark/space strobe.

12. A programmable synchronous digital delay line as defined in claim 4 wherein said write circuit comprises first and second multivibrators connected to function as a write strobe generator receiving inputs from said control clock and said mark/space strobe generator and controlling said digital delay means and said address sensor reset means.

13. A programmable synchronous digital delay line as defined in claim 4 wherein said read circuit comprises first and second multivibrators connected to operate as a read strobe generator receiving an input from said control clock and generating a read strobe, a first NAND gate receiving mark data output pulses from said first programmable digital delay means, a second NAND gate receiving space data output pulses from said second programmable digital delay means, said read strobe controlling said first and second NAND gates, the outputs of said first and second NAND gates feeding said line driver latch output.

14. A programmable synchronous digital delay line as defined in claim 5 wherein said variable length register memory means is a random access memory, said address counter comprises first and second four bit binary counters connected to operate as a ring counter, said delay time program means comprises a plurality of diodes and means for selectably switching each said diode between the digital delay line voltage source and said address counter, said delay time program means operating as an AND comparator, said control clock comprises a decade counter, said means for providing bipolar input data comprises fitrst and second NAND gates, said first NAND gate receiving bipolar input data and having its output connected to the inputs of said second NAND gate, and first, second and third multivibrators, said first multivibrator receiving the output of said second NAND gate and a single frequency clock and operating as a latch means, said second multivibrator receiving an output of said first multivibrator and outputting a mark data pulse stream, and said third multivibrator receiving an output of said first multivibrator and outputting a space data pulse stream, said first and second synchronizer circuits each comprise first and second serial connected gate means receiving an input data pulse stream and providing a buffer and trigger for a multivibrator, a NOR latch controlled by said multivibrator operating a triggered one-shot multivibrator, said one-shot multivibrator providing input data for said digital delay means, and a monostable multivibrator controlled by said one-shot multivibrator for generating a mark/space strobe, said write circuit comprises first and second multivibrators connected to function as a write strobe generator receiving inputs from said control clock and said mark/space strobe generator and controlling said digital delay means and said address sensor reset means, and said read circuit comprises first and second multivibrators connected to operate as a read strobe generator receiving an output from said control clock and generating a read strobe, a first NAND gate receiving mark data output pulses from said first programmable digital delay means, a second NAND gate receiving space data output pulses from said second programmable digital delay means, said read strobe controlling said first and second NAND gates, the outputs of said first and second NAND gates feeding said line drver latch output.

* * * * *